(12) United States Patent
Hino et al.

(10) Patent No.: US 8,680,179 B2
(45) Date of Patent: Mar. 25, 2014

(54) COMPOSITE COMPOSITION FOR MICROPATTERNED LAYERS

(75) Inventors: Etsuko Hino, Tokyo (JP); Mitsutoshi Noguchi, Tokyo (JP); Norio Ohkuma, Tokyo (JP); Yoshikazu Saito, Tokyo (JP); Carsten Becker-Willinger, Saarbruecken (DE); Pamela Kalmes, Merchweiler (DE); Michael Veith, St.-Ingbert (DE)

(73) Assignees: Leibniz-Institut fuer Neue Materialien gemeinnuetzige GmbH, Saarbruecken (DE); Canon Kabushiki Kaisha, Tokyo (JP)

( * ) Notice: Subject to any disclaimer, the term of this patent is extended or adjusted under 35 U.S.C. 154(b) by 1181 days.

(21) Appl. No.: 12/373,750

(22) PCT Filed: Jul. 11, 2007

(86) PCT No.: PCT/EP2007/057103
§ 371 (c)(1), (2), (4) Date: Feb. 12, 2009

(87) PCT Pub. No.: WO2008/009608
PCT Pub. Date: Jan. 24, 2008

(65) Prior Publication Data
US 2010/0260978 A9    Oct. 14, 2010

(30) Foreign Application Priority Data
Jul. 18, 2006 (DE) .......... 10 2006 033 280

(51) Int. Cl.
*C08K 3/34* (2006.01)

(52) U.S. Cl.
USPC ........... 523/433; 523/466; 523/458; 523/459; 524/436; 524/431; 524/432; 524/434; 524/435; 524/437; 524/588; 427/387; 428/447; 522/148; 522/83

(58) Field of Classification Search
USPC ............... 522/148, 83; 427/387; 428/447; 524/436, 431, 432, 434, 435, 437, 588; 523/466, 458, 459, 433
See application file for complete search history.

(56) References Cited

U.S. PATENT DOCUMENTS

| | | | |
|---|---|---|---|
| 4,994,299 A | 2/1991 | Stein et al. | |
| 5,057,550 A | 10/1991 | Lutz et al. | |
| 5,178,959 A | 1/1993 | Eckberg et al. | |
| 5,217,805 A | 6/1993 | Kessel et al. | |
| 5,260,348 A | 11/1993 | Shepherd et al. | |
| 5,411,996 A | 5/1995 | Eckberg et al. | |
| 5,457,003 A | 10/1995 | Tanaka et al. | |
| 5,516,858 A | 5/1996 | Morita et al. | |
| 5,644,014 A | 7/1997 | Schmidt et al. | |
| 5,656,336 A | 8/1997 | Kamen et al. | |
| 5,674,964 A | 10/1997 | Wolter et al. | |
| 5,721,015 A | 2/1998 | Iwamura et al. | |
| 5,910,522 A | 6/1999 | Schmidt et al. | |
| 5,952,439 A | 9/1999 | Morita et al. | |
| 5,973,176 A | 10/1999 | Roscher et al. | |
| 6,121,339 A | 9/2000 | Kominami et al. | |
| 6,183,567 B1 | 2/2001 | Kamijo et al. | |
| 6,248,854 B1 | 6/2001 | Hoehn et al. | |
| 6,358,612 B1 | 3/2002 | Bier et al. | |
| 6,391,999 B1 | 5/2002 | Crivello | |
| 6,423,378 B1 | 7/2002 | Cotting et al. | |
| 6,455,112 B1 | 9/2002 | Ohkuma et al. | |
| 6,476,174 B1 | 11/2002 | Lee et al. | |
| 6,511,753 B1 | 1/2003 | Teranishi et al. | |
| 6,632,897 B1 | 10/2003 | Geiter et al. | |
| 6,723,440 B2 | 4/2004 | Valeri et al. | |
| 6,743,510 B2 | 6/2004 | Ochiai | |
| 6,911,235 B2 | 6/2005 | Frances et al. | |
| 7,985,477 B2 | 7/2011 | Schmidt et al. | |
| 8,017,211 B2 | 9/2011 | Terauchi | |
| 2002/0001016 A1 | 1/2002 | Aono et al. | |
| 2003/0169313 A1 | 9/2003 | Shimomura et al. | |
| 2003/0211338 A1 | 11/2003 | Frances et al. | |
| 2003/0224286 A1 | 12/2003 | Barclay et al. | |
| 2004/0001961 A1 | 1/2004 | Ono et al. | |
| 2005/0131106 A1* | 6/2005 | Tonapi et al. ................. | 523/216 |
| 2006/0132539 A1 | 6/2006 | Hino et al. | |
| 2006/0135723 A1 | 6/2006 | Nakayama | |
| 2006/0153993 A1 | 7/2006 | Schmidt et al. | |
| 2006/0153994 A1 | 7/2006 | Gicquel et al. | |
| 2006/0154091 A1 | 7/2006 | Schmidt et al. | |

(Continued)

FOREIGN PATENT DOCUMENTS

| | | |
|---|---|---|
| CN | 1218437 | 6/1999 |
| CN | 1226263 A | 8/1999 |

(Continued)

OTHER PUBLICATIONS

Office Action for Taiwanese Patent Application No. 93121966 dated Feb. 23, 2011.
English abstract of CN1226263.
English abstract of TW528784.
Japanese Intellectual Property Office, Office Action for Japanese patent application No. 2005-507495 issued Nov. 18, 2009.
English translation of Japanese Intellectual Property Office, Office Action for Japanese patent application No. 2005-507495 issued Nov. 18, 2009 (citing Japanese Patent Publication No. 200-212433).
Japanese Intellectual Property Office, Office Action for Japanese patent application No. 2005-507496 issued Nov. 18, 2009.
English translation of Japanese Intellectual Property Office, Office Action for Japanese patent application No. 2005-507496 issued Nov. 18, 2009 (citing Japanese Patent Publication No. 200-212433).

(Continued)

*Primary Examiner* — Margaret Moore
(74) *Attorney, Agent, or Firm* — Cahn & Samuels, LLP

(57) ABSTRACT

The invention provides a composite composition comprising a cationically polymerizable organic resin, a cationic photoinitiator, a hydrolysate and/or condensate of at least one hydrolysable silane compound and inorganic nanoparticles. The composite composition is suitable for the preparation of patterned moulded articles or substrates having a patterned coating, in particular by photolithography. Micropatterns obtained show improved properties, such as a high shape stability and an excellent elastic modulus.

17 Claims, No Drawings

(56) References Cited

U.S. PATENT DOCUMENTS

| | | |
|---|---|---|
| 2008/0032061 A1 | 2/2008 | Watanabe et al. |
| 2008/0103254 A1 | 5/2008 | Asada |
| 2008/0213547 A1 | 9/2008 | Becker-Willinger et al. |
| 2010/0129587 A1 | 5/2010 | Terauchi |

FOREIGN PATENT DOCUMENTS

| | | |
|---|---|---|
| CN | 1416447 | 5/2003 |
| CN | 1432601 A | 7/2003 |
| DE | 10323729 A1 | 12/2004 |
| DE | 102005002960 A1 | 8/2006 |
| DE | 1020005002960 A1 | 8/2006 |
| EP | 0431809 A2 | 6/1991 |
| EP | 0466025 A2 | 1/1992 |
| EP | 0567969 A1 | 11/1993 |
| EP | 0965618 A1 | 12/1999 |
| EP | 1045290 A2 | 10/2000 |
| EP | 1120448 A2 | 8/2001 |
| EP | 1215254 A2 | 6/2002 |
| JP | 61261365 A | 11/1986 |
| JP | 63048363 A | 3/1988 |
| JP | 03293067 A | 12/1991 |
| JP | 04338958 A | 11/1992 |
| JP | 5262961 A | 10/1993 |
| JP | 06298897 A | 10/1994 |
| JP | 08266994 A | 10/1996 |
| JP | 2000212443 A | 8/2000 |
| JP | 2000347001 A | 12/2000 |
| JP | 2002298648 A | 10/2002 |
| JP | 2003262716 A | 9/2003 |
| JP | 2004010849 A | 1/2004 |
| JP | 2004012810 A | 1/2004 |
| JP | 2004155954 A | 3/2004 |
| JP | 2005004052 A | 1/2005 |
| JP | 2005015581 A | 1/2005 |
| JP | 2005089697 A | 4/2005 |
| JP | 2005336421 A | 8/2005 |
| JP | 2006045523 A | 2/2006 |
| JP | 2006070152 A | 3/2006 |
| JP | 2008133442 A | 6/2008 |
| KR | 20030040065 | 5/2003 |
| TW | 047282 | 11/1982 |
| TW | 149535 B | 1/1991 |
| TW | 482817 B | 4/2002 |
| TW | 528784 B | 4/2003 |
| WO | WO9732732 | 9/1997 |
| WO | WO98/51747 A1 | 11/1998 |
| WO | WO 99/63022 A1 | 12/1999 |
| WO | WO0153385 A1 | 7/2001 |
| WO | 2004/072150 A1 | 8/2004 |
| WO | WO2005/014745 A | 2/2005 |
| WO | WO2005014742 | 2/2005 |
| WO | 2006059702 A1 | 6/2006 |
| WO | WO2006077140 | 7/2006 |
| WO | WO2008009608 A1 | 1/2008 |

OTHER PUBLICATIONS

English Abstract of JP2004010849 A.
English Abstract of JP06298897 A.
English Abstract of JP04338958 A.
English Abstract of 2004012810 A.
English Abstract of 2003262716 A.
English Abstract of 2005336421 A.
English Abstract of JP 2008133442 A.
Japanese Office Action for Application No. 2007-551622 mailed on Jun. 28, 2011.
Office Action for Japanese Patent Application No. 2005-507496, Mailed on Jul. 28, 2010.
Office Action for Japanese Patent Application No. 093121967.
English Abstract of JP 63048363.
English Abstract of WO 99/63022.
English Abstract of JP 08266994.
Machine translation of JP 08266994.
English Abstract of JP 03293067.
English Abstract of CN 1432601.
English Abstract of TW 482817.
Office Action for Japanese Patent Application No. 2005-507495, Mailed on Jul. 28, 2010.
Jiguet, S., et al., "Conductive SU8-silver Composite Photopolymer," IEEE International Conference on Micro Electro Mechanical Systems, Technical Digest, 17thm Jan. 25-29, 2004, pp. 125-128.
Abstract of JP 2004 155954 A.
Abstract of JP 2005 004052 A.
Abstract of DE10323729.
Abstract of DE1020005002960.
Abstract of JP2005015581.
Abstract of JP2005089697.
Abstract of JP2005004052.
Abstract of JP2000347001.
English translation of Japanese Intellectual Property Office, Office Action for Japanese patent application No. 2005-507495 issued Nov. 18, 2009 (citing Japanese Patent Publication No. 2000-212433).
English translation of Japanese Intellectual Property Office, Office Action for Japanese patent application No. 2005-507496 issued Nov. 18, 2009 (citing Japanese Patent Publication No. 2000-212433).
Japanese Application No. 2005-507496, Decision to Decline the Amendment, dated May 31, 2011.
Japanese Application No. 2005-507496, Decision of Final Rejection, dated May 31, 2011.
Abstract of DE102005002960.
English Abstract of WO 2004/072150.
Taiwanese Office Action and Search Report dated Jun. 25, 2012.
English Abstract of JP 2000212443.
Daicel Chemical Industries, Ltd., Data Sheet: EHPE 3150, http://www.daicel.co.jp/kinouhin/english/syousai/ehpe_3150.html, printed on Jul. 29, 2009.
English Abstract of EP0466025.
English Abstract of EP0965618.
English Abstract of EP1120448.
English Abstract of EP1215254.
English Abstract of EP0431809.
English Abstract of EP1045290.
English Abstract of EP0567969.
English Abstract of JP5262961.
English Abstract of WO0153385.
English Abstract of WO2008009608.
English Abstract of CN1218437.
English Abstract of CN1416447.
English Abstract of KR20030040065.
English Abstract of WO2006077140.
English Abstract of WO2005014742.
English Abstract of WO199732732.
English Abstract of JP 2006070152.
English Abstract of JP 2002298648.
English Abstract of JP 61261365.
English Abstract of JP 2006045523.
Japanese Office Action for Application No. 2009-519938 mailed on Oct. 18, 2011.
Taiwanese Decision of Rejection for Application No. 093121966 dated Sep. 28, 2011.

* cited by examiner

COMPOSITE COMPOSITION FOR MICROPATTERNED LAYERS

This patent application is a U.S. national stage application of PCT international application PCT/EP2007/057103 filed on Jul. 11, 2007 which claims priority of German patent document 10 2006 033 280.6 filed on Jul. 18, 2006.

FIELD OF THE INVENTION

The present invention relates to a composite composition based on organic components containing polymerizable groups, inorganic components and inorganic nanoparticles, to patterned moulded articles and substrates having a patterned coating obtained from this composite composition, and to a method of preparing such substrates and moulded articles. The patterns can comprise micropatterns.

BACKGROUND OF THE INVENTION

Inorganic materials derived from the sol-gel process usually show excellent mechanical properties from the viewpoint of abrasion and wear resistance. This behaviour is connected with a high surface hardness accompanied by a high elastic modulus which is a measure for the stiffness, also in the densified material. One disadvantage of this type of materials is the required high processing temperature of about 450° C.-500° C. in combination with long processing times in order to obtain completely densified layers or moulded articles. This complete densification is an important step to obtain a high elastic modulus together with sufficient strength. Another disadvantage is the high volume shrinkage which occurs during densification which may lead to residual stresses in the materials in many cases. Therefore the maximum layer thickness which can be achieved without occurrence of cracks in the layers is usually limited to only a few micrometers if reasonable curing times are considered and for this reason it is almost impossible to obtain patterns with a high aspect ratio.

On the other hand, layers or even foils with a thickness in the millimeter range without cracks can be produced from materials based on organic polymers such as e.g. polyimides due to their higher relaxation ability compared to the sol-gel derived inorganic materials. Besides a high strength the pristine polyimide type polymers also show a quite high elastic modulus in the range of 5 GPa which is caused by their structure along the polymer chain mainly consisting of aromatic and aromatic-aliphatic group containing monomer units. On the other hand, such excellent mechanical behaviour of the polyimides can only be reached when a densification temperature of about 300° C. is applied, which is still quite high.

When polymerizable groups such as e.g. unsaturated carbon-carbon double bonds are introduced in such systems to obtain patternability, the required curing temperature usually decreases, but in all cases the mechanical properties decrease significantly at the same time. Another disadvantage of polymer systems having aromatic groups in the structure is that they are not completely colourless because of light absorption of the conjugated double bond systems in the visible range, thus limiting the obtainable aspect ratio to some extent if fine-patterning processes like photolithography are involved.

Several approaches have been followed in the past to overcome the drawbacks of both pure inorganic and organic polycondensates mentioned above wherein inorganic structures with intrinsic high elastic modulus and organic radiation curable structural units have been combined. Nanoparticles have been used to provide inorganic rigid phases in a softer and photopolymerizable matrix in order to avoid light scattering and maintain transparency. JP-A-2005015581, JP-A-2005089697 and JP-A-2000347001 describe compositions comprising organic or organic-inorganic photopolymerizable polymers having epoxy groups which may also contain inorganic particles. These compositions have been used for transparent hard coatings. On the other hand, patterned structures are not described.

Organic matrices derived from polymers filled with rather high loadings (e.g. up to 30 vol. %) of inorganic nanoparticles have been prepared. For example, EP-A-0819151 describes such matrices for transparent composite adhesives. A photopatterning process such as photolithography requires shape stability as well as chemical resistance, if patterns with high aspect ratio are desired. However, the limited resistance of organic matrices against organic solvents would cause undesired swelling or even dissolution of the matrix. Moreover, the viscous flow behaviour is directly connected to the viscous behaviour of the monomers used and usually results in insufficient shape stability of created patterns if the processing temperature is increased.

As a consequence, fine patterning with an aspect ratio >1 can usually not be achieved with such organic matrices due to undesired flow and swelling behaviour which reduces patterning accuracy and the final mechanical properties. For these reasons patterning is also not described for such types of systems.

EP-A-0991673, WO-A-98151747 and JP-A-2005004052 describe photocurable systems based on methacrylate or methacrylate hybrid matrices which can be patterned with reasonable aspect ratios in the range of 1 (height/width) using photolithographic techniques. On the other hand, these systems suffer from a limited chemical stability due to the possible hydrolytic attack on the ester bonds by bases, acids or organic solvents and limited temperature stability. These drawbacks limit their usability for microelectronic devices for which a high stability is required in many fabrication processes.

DE-A-10323729 describe organic-inorganic nanocomposites consisting of hybrid polymer-like matrix showing thixotropy which is a well-known viscosity property. Said systems may contain inorganic particles in order to control the viscosity behaviour. These thixoptropic systems are suitable for mechanical patterning processes such as embossing with a stamp. The disadvantage is that even at high degrees of filling with nanoparticles the mechanical properties of the cured nanocomposite systems are mainly dominated by the matrix and a rather weak interface, because the interaction forces between particle surface and matrix are too low to allow the reversible flow behaviour related to thixotropy and therefore effective stress transfer from the matrix to the incorporated inorganic nanophases is impeded.

DE-A-102005002960 describes a composite composition for micropatterned layers comprising a hydrolysate or condensate of organosilanes, an organic compound having at least 2 epoxy groups and a cationic initiator. With said composite compositions improved patterned structures can be obtained. However, for some applications an improved elastic modulus of the material is desirable, in particular if the system is cured under mild conditions.

SUMMARY OF THE INVENTION

An object of the invention was to find a film or bulk forming system which is appropriate for the preparation of micropatterned surfaces in form of layers or moulded articles with high aspect ratio patterns by photolithography and shows improved mechanical properties and chemical stability so that it can be used for the production of e.g. micromachines or microintegrated systems.

It has surprisingly been found that this object can be achieved by a composite composition comprising a) at least one cationically polymerizable organic resin, which is solid at room temperature, b) a cationic photoinitiator, c) inorganic nanoparticles, and d) a hydrolysate and/or condensate of at least one hydrolysable silane compound.

DESCRIPTION OF THE PREFERRED EMBODIMENTS

In a preferred embodiment the hydrolysate and/or condensate comprises cationically polymerizable groups, e.g. derived from epoxy functionalised alkoxides, preferably, epoxy silanes, which are used as hydrolysable compounds for preparing the hydrolysate and/or condensate. The polymerizable organic resin is preferably a multifunctional epoxy resin. Moreover, it is preferred that the inorganic nanoparticles have non-polymerizable or polymerizable organic surface groups. Said surface groups enable e.g. compatibilization or linkage of the nanoparticles with the matrix formed from the hydrolysate and/or condensate and the organic resin in a cationic polymerisation reaction using said cationic photoinitiators. This cationic chain reaction is also used in the photolithographic process. Similar types of precursors or monomers following the same reaction principle can be used as well of course.

In order to obtain high mechanical, thermal and chemical stability properties the nanoparticles are preferably used in concentrations of at least 30 vol. %, based on the total volume of the cured final layer obtained, and it is further preferred that the nanoparticles are almost perfectly distributed within the matrix, i.e. homogeneously distributed within the matrix, to form a homogeneously cross-linked organic/inorganic network with a high glass transition temperature and high stiffness (elastic modulus).

Concerning the excellent photopatterning behaviour observed, it is assumed that the active species from the cationic photopolymerisation reaction of the cationically polymerizable groups, in particular the epoxy groups are active for some time after completion of the illumination step and are further promoted in their activity during a thermal post treatment step (e.g. some minutes at 90° C.) in such a way that the cationically polymerized groups are converted to high molecular weight polyether structural units. The three dimensional cross-linking of the created organic polyether units form with the pre-condensed inorganic network and the nanoparticles via the cationically polymerizable groups thereof, which are preferably derived from epoxy silane, an intensively cross-linked structure with sufficiently high glass transition temperature, which shows a high resistance against organic developing solvents such as e.g. ketones and which does not flow during the thermal post treatment, i.e. provides shape stability.

The excellent mechanical properties of the new materials are directly connected to the well dispersed inorganic nanoparticles intensively cross-linked with the matrix thereby strongly increasing the network connectivity and at the same time immobilising the polymer like matrix structure at the interface nanoparticle/matrix which surprisingly result in a higher stiffness of the matrix near the interface due to hindered segmental mobility and to a high elastic modulus of the material, even if mild curing conditions are applied such as UV curing or thermal post curing at <100° C. Furthermore the high molecular weight organic polyether structures formed in the photopolymerisation reaction of the epoxy functions show high hydrolytic stability in contrast to e.g. polymethacrylate structures and protect the silane network part against hydrolytic attack from basic media leading to an advantageous combination of organic and inorganic structural units. The shape stability is also improved. In the following, the present invention will be described in more detail.

The composite composition of the invention comprises a hydrolysis and/or condensation product of at least one hydrolysable silane compound. The silane compound comprises at least one hydrolysable group and preferably 2 or 3 hydrolysable groups, e.g. groups X as defined below for general formula (I). It is preferred that the silane compound comprises at least one non-hydrolysable group and preferably 1 or 2 non-hydrolysable groups, e.g. groups R, R' or Rc as defined below for general formulas (I), (II) and (III), respectively. A silane compound generally has 4 substituents.

It is preferred that at least one of said hydrolysable silane compounds has a non-hydrolysable substituent which comprises a cationically polymerizable group such as an epoxy group or a non-hydrolysable substituent which is an aryl group; preferably both a silane compound having a non-hydrolysable substituent which comprises a cationically polymerisable group and a silane compound having a non-hydrolysable substituent which is an aryl group, are used for preparing the hydrolysate and/or condensate.

In a preferred embodiment the silane compound(s) used are selected from one or more of the group consisting of a1) at least one hydrolysable alkylsilane having at least one alkyl group, a2) at least one hydrolysable arylsilane having at least one aryl group wherein the term arylsilane as used herein refers also to alkylarylsilane having at least one alkylaryl group, and a3) at least one hydrolysable silane containing a cationically polymerizable group, preferably an epoxy group. It is preferred that the hydrolysate and/or condensate is prepared from a2) at least one hydrolysable arylsilane, and a3) at least one hydrolysable silane containing an epoxy group, and optionally a1) at least one hydrolysable alkylsilane, as defined above.

The hydrolysable alkylsilane comprises at least one alkyl group that is directly attached to the Si atom. Said alkyl group directly attached to Si is a non-hydrolysable group as is generally known. The alkyl group may be linear or branched. The alkyl group may have substituents such as chlorine, though an unsubstituted alkyl is more preferred. The alkyl group is generally a $C_{1-10}$ alkyl group, preferably a $C_{1-5}$ alkyl group and particular preferably a methyl group. The lower alkyl groups provide an enhanced modulus of elasticity. The alkylsilane may contain further alkyl groups directly attached to Si. The hydrolysable groups are those generally used and well-known to the persons skilled in the art.

The hydrolysable alkylsilane is preferably selected from compounds represented by the general formula (I)

$$R_a SiX_{(4-a)} \quad \text{(I)}$$

wherein R, which may be the same or different, is an alkyl substituent, X is a hydrolysable substituent, and a is an integer of from 1 to 3. n is preferably 1 or 2, and more preferably 1.

In general formula (I) the hydrolysable substituents X, which may be identical or different from one another, are, for example, hydrogen or halogen (F, Cl, Br or I), alkoxy (preferably $C_{1-6}$ alkoxy, such as methoxy, ethoxy, n-propoxy, isopropoxy and n-butoxy, sec-butoxy, isobutoxy, and tert-butoxy), aryloxy (preferably $C_{6-10}$ aryloxy, such as phenoxy), acyloxy (preferably $C_{1-6}$ acyloxy, such as acetoxy or propionyloxy), alkylcarbonyl (preferably $C_{2-7}$ alkylcarbonyl, such as acetyl), amino, monoalkylamino or dialkylamino having preferably from 1 to 12, in particular from 1 to 6, carbon atoms. Preferred hydrolysable radicals are halogen, alkoxy groups, and acyloxy groups. Particularly preferred hydrolysable radicals are $C_{1-4}$ alkoxy groups, especially methoxy and ethoxy.

The non-hydrolysable substituent R, which may be identical to or different from one another, is an alkyl group, e.g. $C_1$-$C_{10}$ alkyl, preferably $C_1$-$C_5$ alkyl, in particular methyl. The alkyl group may be linear or branched. Examples are methyl, ethyl, n-propyl, isopropyl, n-butyl, s-butyl and t-butyl, as well as linear or branched pentyl, hexyl, heptyl, octyl, nonyl, decyl, dodecyl, hexadecyl. The alkyl groups include also cycloalkyl. Though radicals R may contain one or more substituents such as halogen, this is not preferred.

Specific, non-limiting examples of said hydrolysable alkylsilanes are methyl-trimethoxysilane, methyltriethoxysilane, methyltripropoxysilane, ethyltrimethoxysilane, ethyltriethoxysilane, ethyltripropoxysilane, propyltrimethoxysilane, propyltriethoxysilane, propyltripropoxysilane, dimethyldiethoxysilane, dimethyldimethoxysilane, n-butyltrimethoxysilane, n-butyltriethoxysilane, t-butyltrimethoxysilane, t-butyltriethoxysilane, hexyltrimethoxysilane, hexyltriethoxysilane, decyltrimethoxysilane and decyltriethoxysilane.

The hydrolysable arylsilanes comprise at least one aryl or alkylaryl group that is directly attached to the Si atom. Said groups directly attached to Si are non-hydrolysable groups as is generally known. The aryl or alkylaryl groups may be substituted or unsubstituted and are non-polymerizable groups. Substituents may be halogen, such as chlorine or bromine, and alkyl, for example those mentioned above. Hence, aryl includes also alkylaryl. A preferred aryl group is substituted or unsubstituted phenyl. The hydrolysable arylsilane or alkylarylsilane may also contain other non-hydrolysable groups such as the alkyl groups mentioned above.

The hydrolysable arylsilane is preferably selected from compounds represented by the general formula (II)

$$R'_a SiX_{(4-a)} \quad (II)$$

wherein R', which may be the same or different, is a non-hydrolysable substituent selected from alkyl, aryl, and alkylaryl, at least one of which is an aryl or alkylaryl group, X is a hydrolysable substituent, and a is an integer from 1 to 3, preferably 1 or 2.

Group X has the same meaning as in general formula (I). If an alkyl is contained as a non-hydrolysable radical R', reference can be made to the definitions of general formula (I) for suitable alkyl groups. Examples of aryl or alkylaryl groups R' are substituted and unsubstituted phenyl, naphthyl, benzyl and tolyl. R' may contain one or more substituents, such as halogen, alkyl, and alkoxy. R' may contain for example 6 to 20 carbon atoms.

Specific, non-limiting examples of said hydrolysable arylsilanes are phenyltrimethoxysilane, phenyltriethoxysilane, phenyltripropoxysilane, diphenyldimethoxysilane, and diphenyldiethoxysilane.

The hydrolysable silane containing an epoxy group, also called epoxysilane, comprises at least one hydrolysable substituent and at least one non-hydrolysable substituent containing at least one epoxy group. The epoxy group is a cationically polymerizable group which can be polymerised or crosslinked by a cationic initiator. Epoxy groups include glycidyl and glycidyloxy groups.

A preferred hydrolysable silane having an epoxy group is a compound of general formula (III):

$$RcSi(R)_b X_{(3-b)} \quad (III)$$

wherein Rc is a non-hydrolysable substituent having a epoxy group, R is a non-hydrolysable substituent, X is a hydrolysable substituent, and b is an integer of from 0 to 2, preferably 0. The groups X are as defined in general formula (I) and formula (II) above. R may be an alkyl, aryl or alkylaryl group as defined for R in formula (I) or for R' in formula (II).

The non-hydrolysable substituent Rc comprises at least and preferably only one epoxide group (e.g. glycidyl or glycidyloxy group), which is attached to the silicon atom by way of a divalent organic group, such as alkylene, including cycloalkylene, and alkenylene bridge groups, which may be interrupted by oxygen or —NH— groups. The bridge may contain one or more conventional substituents such as halogen or alkoxy. The bridge is preferably $C_{1-20}$ alkylene, more preferably a $C_{1-6}$ alkylene, which may be substituted, for example, methylene, ethylene, propylene or butylene, especially propylene, or cyclohexylalkyl, especially cyclohexylethyl.

Specific examples of said substituent Rc are glycidyl or glycidyloxy $C_{1-20}$ alkyl, such as γ-glycidylpropyl, β-glycidyloxyethyl, γ-glycidyloxypropyl, δ-glycidyloxybutyl, ε-glycidyloxypentyl, ω-glycidyloxyhexyl, and 2-(3,4-epoxycyclohexyl)ethyl. The most preferred substituents Rc are glycidyloxypropyl and epoxycyclohexylethyl.

Specific examples of corresponding silanes are γ-glycidoxypropyltrimethoxysilane (GPTS), γ-glycidoxypropyltriethoxysilane (GPTES), glycidyloxypropylmethyldialkoxysilane and glycidyloxypropyldimethylmonoalkoxysilane, wherein alkoxy is methoxy or ethoxy, epoxycyclohexylethyltrimethoxysilane, and epoxycyclohexylethyltriethoxysilane. However, the invention is not limited to the above-mentioned compounds.

Another example for an appropriate hydrolysable silane compound which can be used alone or in combination with other hydrolysable silane compounds is a hydrolysable silane compound which has a fluorine atom, i.e. a silane having a non-hydrolysable radical substituted by at least 1 fluorine atom. Such silanes are described e.g. in WO 92/21729. Examples are hydrolysable silanes of general formula $$Rf(R)_b SiX_{(3-b)} \quad (IV)$$

in which X and R are defined as in formula (I), RF is a nonhydrolysable group which has 1 to 30 fluorine atoms bonded to carbon atoms which are preferably separated from Si by at least two atoms, preferably an ethylene group, and b is 0, 1 or 2. R is in particular a radical without a functional group, preferably an alkyl group, such as methyl or ethyl. The groups RF preferably contain 1 to 25 and in particular 3 to 18 fluorine atoms which are preferably bonded to aliphatic carbon atoms. RF is preferably a fluorinated alkyl group having 3 to 20 carbon atoms, and examples are $CF_3CH_2CH_2$—, $C_2F_5CH_2CH_2$—, n-$C_6F_{13}CH_2CH_2$—, i-$C_3F_7OCH_2CH_2CH_2$—, n-$C_8F_{17}CH_2CH_2$— and n-$C_{10}F_{21}$—$CH_2CH_2$—.

Examples of fluorosilanes which may be used are $CF_3CH_2CH_2SiCl_2(CH_3)$, $CF_3CH_2CH_2SiCl(CH_3)_2$, $CF_3CH_2CH_2Si(CH_3)(OCH_3)_2$, $C_2F_5$—$CH_2CH_2$—$SiZ_3$, n-$C_6F_{13}$—$CH_2CH_2SiZ_3$, n-$C_8F_{17}$—$CH_2CH_2$—$SiZ_3$, n-$C_{10}F_{21}$—$CH_2CH_2SiZ_3$ with (Z=$OCH_3$, $OC_2H_5$ or Cl), i-$C_3F_7O$—$CH_2CH_2CH_2$—$SiCl_2(CH_3)$, n-$C_6F_{13}$—$CH_2CH_2$—$Si(OCH_2CH_3)_2$, n-$C_6F_{13}$—$CH_2CH_2$—$SiCl_2(CH_3)$ and n-$C_6F_{13}$—$CH_2CH_2$—$SiCl(CH_3)_2$.

Generally, the hydrolysate and/or condensate is a hydrolysis and/or condensation product of the above-mentioned hydrolysable silanes prepared by hydrolysis and condensation of said starting compounds in accordance with the sol-gel method, which is known to those skilled in the art. The sol-gel method generally comprises the hydrolysis of said hydrolysable silanes, optionally aided by acid or basic catalysis. The hydrolysed species will typically condense partially. The hydrolysis and condensation reactions cause the formation of condensation products having e.g. hydroxy groups and/or oxo bridges. The hydrolysis/condensation product may be controlled by appropriately adjusting parameters, such as e.g. the water content for hydrolysis, temperature, period of time, pH value, solvent type, and solvent amount, in order to obtain the condensation degree and viscosity desired.

Moreover, it is also possible to add a metal alkoxide in order to catalyse the hydrolysis and to control the degree of condensation. For said metal alkoxide, those hydrolysable metal compounds defined below may be used, especially an aluminum alkoxide, a titanium alkoxide, a zirconium alkoxide, and corresponding complex compounds (e.g. with acetyl acetone as the complex ligand) are appropriate.

In the sol-gel process, a solvent may be used. However, it is also possible to conduct the sol-gel process without a solvent. Usual solvents may be used, e.g. water, alcohols such as aliphatic $C_1$-$C_8$ alcohols, e.g. methanol, ethanol, 1-propanol, isopropanol and n-butanol, ketones, such as $C_{1-6}$ alkylketones, e.g. acetone and methyl isobutyl ketone, ether, such as $C_{1-6}$ dialkylether, e.g. diethylether, or diolmonoether, amides, e.g. dimethylformamide, tetrahydrofuran, dioxane, sulfoxides, sulfones, and glycol, e.g. butylglycol, and mixtures thereof. Alcohols are preferred solvents. The alcohol obtained during the hydrolysis of hydrolysable silane alkoxides may serve as a solvent.

Further details of the sol-gel process may e.g. be found in C. J. Brinker, G. W. Scherer: "Sol-Gel Science—The Physics and Chemistry of Sol-Gel-Processing", Academic Press, Boston, San Diego, New York, Sydney (1990).

Instead of the hydrolysable silane monomers already partially or completely (pre)hydrolysed species or precondensates of said monomers may be used as starting materials. The hydrolysate and/or condensate used in the present invention preferably represents an organically modified inorganic polycondensate due to the non-hydrolysable organic substituents of the silanes used. The condensation degree and viscosity depend from the properties desired and can be controlled by the skilled person. Usually a rather complete condensation degree in respect to silicon will be obtained in the final cured product. The cationically polymerizable groups such as the epoxy groups contained in the hydrolysate and/or condensate of the composite composition are normally yet essentially unreacted and serve for polymerising or crosslinking during the following curing step.

For the preparation of the hydrolysate and/or condensate also other hydrolysable metal or semimetal compounds may be used in minor amounts. These hydrolysable compounds may be selected from at least one metal or semimetal M from main groups III to V, especially III and IV and/or transition groups II to V of the periodic table of the elements, and preferably comprise hydrolysable compounds of Si, Al, B, Sn, Ti, Zr, V or Zn, especially those of Si, Al, Ti or Zr, or mixtures of two or more of these elements. These compounds normally satisfy the formula $MX_n$ wherein X is as defined in formula (I), typically alkoxy, and n equals the valence of the metal or semimetal M (usually 3 or 4). One or more substituents X may be substituted by a chelate ligand. Also, hydrolysable compounds of metals of main groups I and II of the periodic table (e.g., Na, K, Ca and Mg), from transition groups VI to VIII of the periodic table (e.g., Mn, Cr, Fe, and Ni), and of the lanthanides may be used. These other hydrolysable compounds are generally used in low amounts, e.g. up to 30 mol-% in respect to the hydrolysate and/or condensate or in catalytic amounts as mentioned above, if at all.

The order of hydrolysing and/or condensing the hydrolysable silanes mentioned having non-hydrolysable groups and optionally other hydrolysable metal or semimetal compounds is not specifically limited. For example, the hydrolysable compounds may be hydrolysed and condensed together. Alternatively, one or more hydrolysable compounds may be hydrolysed or condensed separately from the other components at least in part and then mixed with the other components.

The degree of condensation reaction can be defined by the ratio of the number of condensed functional groups to the number of condensable functional groups. In practice, it can be estimated by Si-NMR measurement, and for example, in the case of a trifunctional silane compound, the degree of condensation can be calculated by the following equation using the ratio among the components shown below:

T0: a Si atom that is not bonded to another silane molecule;
T1: a Si atom that is bonded to one silane molecule through siloxane bond;
T2: a Si atom which is bonded to two silane molecules through siloxane bond; and
T3: a Si atom that is bonded to three silane molecules through siloxane bond;

$$\text{degree of condensation}(\%) = ((T1+2\times T2+3\times T3)\times 100)/(3\times(T0+T1+T2+T3))$$

The degree of condensation varies in accordance with the types of silane compounds and synthetic conditions. When the degree of condensation is excessively low, the compatibility with a resin and the coating properties may become inferior in some cases. Hence, the degree of condensation is preferably 20% or more and more preferably 30% or more.

Patternability can be improved by control of the degree of condensation. The abundance ratio of T0 and T1 is preferably 50% or less in sum total. Furthermore, it is more preferably 30% or less. The abundance ratio of T3 is preferably 15% or more and more preferably 20% or more. The abundance ratio can be calculated by the following equation:

$$\text{abundance ratio of } TX(X=0,1,2,3)(\%) = TX/(T0+T1+T2+T3)\times 100\%$$

The proportion of the silanes used for preparing the hydrolysate and/or condensate can vary in wide ranges. Generally, from 0 to 60 mol-%, preferably 10 to 50 mol-%, of at least one hydrolysable alkylsilane, from 30 to 80 mol-%, preferably 35 to 55 mol-%, of at least one hydrolysable arylsilane or alkylarylsilane, and from 1 to 80 mol-%, preferably 5 to 60 mol-%, of at least one hydrolysable silane containing an epoxy group, based on the total amount of hydrolysable compounds, are used for the hydrolysate and/or condensate. Of course, if already condensed species such as dimers or oligomers are used as starting compounds, the proportion is to be calculated in respect to the monomeric hydrolysable or hydrolysed compounds from which they are derived. As mentioned above, optionally other hydrolysable metal or semi metal compounds may be added in minor amounts, e.g. up to 30 mol-%.

The composite composition further comprises at least one cationically polymerizable organic resin, which has at least one, preferably at least 2 or 3 cationically polymerizable groups in one molecule. The cationically polymerizable group is preferably an epoxy group so that an organic resin is usually an epoxy resin, wherein those having at least 3 epoxy groups are particularly preferred. The organic resin includes monomers, oligomers (such as dimers, trimers, etc.) or polymers or mixtures thereof. Such organic resins are known to those skilled in the art. Generally cationic polymerisation is accelerated by thermal treatment. That is, the polymerisation reaction depends on the diffusion of activated species (protons).

The cationically polymerizable organic resin is solid at room temperature (20° C.). Thus, unnecessary diffusion during the patternwise exposure process can be prevented and a high-resolution patterning can be obtained. The melting point of the compound is preferably 40° C. or higher for producing high-resolution pattering.

Preferably, said organic resin has an epoxide equivalent of 2,000 or less and more preferably an epoxide equivalent of 1,000 or less. When the epoxide equivalent is 2,000 or less, the cross-linking density obtained after curing is increased so that a too low Tg or heat distortion temperature of the cured product can be avoided and adhesion properties to a substrate and resistance to chemical attack are improved.

Examples of said epoxy compounds are epoxy resins having at least one or at least 2, preferably at least 3 of the structural units (1) or (2):

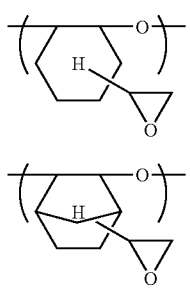

Furthermore, a novolac type epoxy resin having a bisphenol structure as shown below is also preferably used.

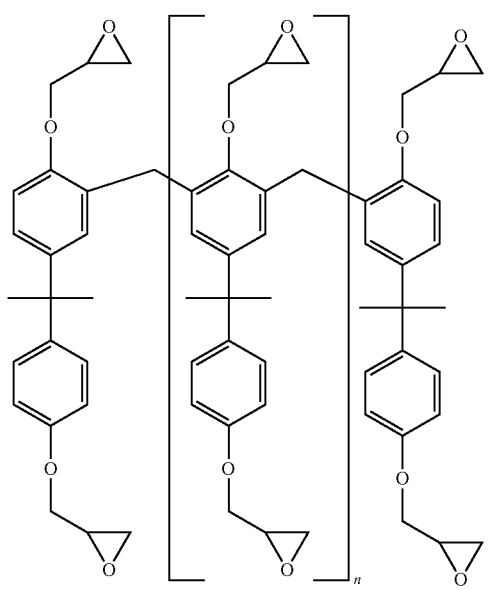

In this formula, n indicates 1, 2 or 3. Especially it is preferable in the case of n=2.

Further examples are epoxy resins of the bisphenol type (e.g. bisphenol A diglycidylether (Araldit® GY 266 (Ciba)), bisphenol F diglycidylether), epoxy resins of the novolak type, such as phenol novolak (e.g. poly[(phenyl-2,3-epoxypropylether)-ω-formaldehyde]) and cresol novolak, and epoxy resins of the triphenylolmethane type, e.g. triphenylolmethane triglycidylether, as well as cycloaliphatic epoxy resins, e.g. 4-vinylcyclohexenediepoxide, 3,4-epoxycyclohexane carboxylic acid-(3,4-epoxycyclohexylmethylester (UVR 6110, UVR 6128 (Union Carbide)), tetrahydro and hexahydrophtalic acid diglycidylether, and glycidylether of polyols. Additional examples are N,N-bis-(2,3-epoxypropyl)-4-(2,3-epoxypropoxy)aniline and bis-{4-[bis-(2,3-epoxypropyl)-amino]-phenyl}methane.

The mixing ratio by weight of said hydrolysate and/or condensate and said organic epoxy compound in the composite composition is preferably about 1:10 to 4:1. The hydrolysate and/or condensate refer to the hydrolysate and/or condensate as such, i.e. without solvent.

The composite composition according to the present invention further contains a cationic photoinitiator which are commercially available and known in the art. The specific type of the cationic initiator used may e.g. depend on the type of cationically polymerizable groups present, the temperature, the type of radiation etc.

Representative of cationic initiators that can be used include onium salts, such as sulfonium, iodonium, carbonium, oxonium, silicenium, dioxolenium, aryldiazonium, selenonium, ferrocenium and immonium salts, borate salts, e.g. [$BF_3OH$]H (obtainable from $BF_3$ and traces of water) and corresponding salts of Lewis acids such as $AlCl_3$, $TiCl_4$, $SnCl_4$, compounds containing an imide structure or a triazene structure, Meerwein complexes, e.g. [$(C_2H_5)_3O$]$BF_4$, perchloric acid, azo compounds and peroxides. Aromatic sulfonium salts or aromatic iodonium salts are advantageous as cationic photoinitiators in view of sensitivity and stability. Cationic photoinitiators are commercially available, examples being the photoinitiators Degacure® KI 85 (bis[4-(diphenylsulfonio)phenyl]sulfide-bis-hexafluorphosphate), Cyracure® UVI-6974/UVI-6990, Rhodorsil® 2074 (tolyl-cumyliodonium-tetrakis(penta-fluorophenylborate)), Silicolease UV200 Cata® (diphenyliodonium-tetrakis(penta-fluorophenylborate)) and SP170® (4,4'-bis[di(β-hydroxyethoxy)phenylsulfonio]phenyl-sulfide-bis-hexafluoroantimonate).

The composite composition according to the invention further contains inorganic nanoparticles. Nanoparticles are particles having a mean particle diameter in the nanometer range, i.e. less than 1.000 nm. The mean particle diameter as used herein refers to the particle diameter based on the volume average ($d_{50}$ value), which can be determined by UPA (Ultrafine Particle Analyzer, Leeds Northrup (laser optical, dynamic laser light scattering)). Preferably, the inorganic nanoparticles have a mean particle diameter of not more than 200 nm, more preferably not more than 100 nm, and in particular not more than 50 nm. The mean particle diameter may be more than 1 nm or more than 2 nm, e.g., in the range of 1 to 100 nm.

The inorganic nanoparticles are preferably composed of metals or metal or non-metal compounds, for example (possibly hydrated) oxides such as ZnO, CdO, $SiO_2$, $TiO_2$, $ZrO_2$, $CeO_2$, $SnO_2$, $Al_2O_3$, AlO(OH), $In_2O_3$, $La_2O_3$, $Fe_2O_3$, other oxides of Fe, $Cu_2O$, $Ta_2O_5$, $Hf_2O_5$, $Nb_2O_5$, $V_2O_5$, $MoO_3$ or $WO_3$; chalcogenides such as, for example, sulphides (e.g. CdS, ZnS, PbS and $Ag_2S$), selenides (e.g. GaSe, CdSe and ZnSe) and tellurides (e.g. ZnTe or CdTe), halides such as AgCl, AgBr, AgI, CuCl, CuBr, $CdI_2$ and $PbI_2$; carbides such as $CdC_2$ or SiC; arsenides such as AlAs, GaAs and GeAs; antimonides such as InSb; nitrides such as BN, AlN, $Si_3N_4$ and $Ti_3N_4$; phosphides such as GaP, InP, $Zn_3P_2$, and $Cd_3P_2$, phosphates, silicates, zirconates, aluminates, stannates, and the corresponding mixed oxides (e.g. metal-tin oxides, such as indium-tin oxide (ITO), antimony-tin oxide (ATO), fluorine-doped tin oxide (FTO), Zn-doped $Al_2O_3$, fluorescent pigments with Y or Eu compounds, or mixed oxides with perovskite structure such as $BaTiO_3$ and $PbTiO_3$). It is also possible to use mixtures of different nanoparticles.

The inorganic nanoparticles preferably comprise a metal or non-metal compound, preferably an oxide, oxide hydrate, or mixed oxide of Si, Al, B, Zn, Cd, Ti, Zr, Hf, Ce, Sn, In, La, Fe, Cu, Ta, Nb, V, Mo or W, with particular preference of Si, Al, B, Ta, Ti, and Zr. Preferred inorganic nanoparticles are $SiO_2$, $TiO_2$, $ZrO_2$, $Al_2O_3$, AlO(OH), $CeO_2$, $SnO_2$, ITO, ATO, $Ta_2O_5$ and $BaTiO_3$.

The nanoparticles used in accordance with the invention may be produced conventionally: for example, by flame pyrolysis, plasma processes, gas-phase condensation processes, colloid techniques, precipitation processes, sol-gel processes, controlled nucleation and growth processes, MOCVD processes, and (micro)emulsion processes. These processes are described in detail in the literature. It is possible in particular to draw, for example, on metals (for example, after the reduction of the precipitation processes), ceramic oxidic systems (by precipitation from solution), and also salt-like systems or multicomponent systems. The multicomponent systems also include semiconductor systems.

Use may also be made of commercially available nanoscale inorganic solid particles. Examples of commercially available nanoscale $SiO_2$ particles are commercial silica products, e.g., silica sols, such as the Levasils®, silica sols from Bayer AG, or fumed silicas, e.g., the Aerosil products from Degussa.

Generally, reactive groups as residual valences are present as surface groups on such nanoparticles, which depends e.g. on the nature of the particle and the preparation method. For example, in the case of oxide, oxide hydrate, or mixed oxide such reactive groups may include hydroxyl groups and oxy groups, or, depending from the pH value, ionic forms thereof. Also groups from the starting materials such as alkoxy groups e.g. propoxy groups may be present on the surface.

In a particular embodiment, the nanoparticles are surface-modified with radicals, i.e. there are radicals, preferably containing or being organic groups or molecules, attached to the surface of the particles. The groups present on the surfaces of the nanoscale particles may contain polymerizable or non-polymerizable groups. Preferred are cationically polymerizable groups, such as epoxy, oxetane or vinylether groups, in particular epoxy groups.

The preparation of surface-modified nanoparticies provided that may be used in accordance with the invention may in principle be carried out in two different ways, namely first by surface modification of pre-prepared nanoparticles and secondly by preparation of these nanoparticles in the presence of a compound which possess such surface-modifying groups (surface modifier) which can be considered an in situ preparation. Such processes suitable for producing surface-modified nanoparticles are established in the state of the art, see for example DE-A-19719948.

Where surface modification of pre-prepared nanoscale particles is carried out, surface modifiers suitable for this purpose are compounds which on the one hand possess one or more groups which are able to react or at least interact with reactive groups present on the surface of the nanoparticles (such as OH groups, for example, in the case of oxides) and on the other hand contain the surface-modifying radical, e.g., a cationically polymerizable group. Surface modification of the nanoscale particles may be accomplished, for example, by mixing them with suitable compounds (surface modifiers) elucidated below, where appropriate in a solvent and in the presence of a catalyst. For example, it may be sufficient, to stir the surface modifier with the nanoparticles at room temperature for a number of hours.

The surface modification may include a reaction between the particle, more precisely surface groups of the particle, and the surface modifier to form covalent, ionic (saltlike) or coordinative (complex) bonds to the surface of the nanoscale solid particles, whereas simple interactions include, for example, dipole-dipole interactions, hydrogen bonding, and van der Waals interactions. Preference is given to the formation of covalent, ionic and/or coordinate bonding. It is preferred for the surface modifying radicals present on the surfaces of the nanoparticles to have a relatively low molecular weight. In particular, the molecular weight of the radicals should not exceed 600 and preferably 400, more preferably 300. This does not of course rule out a significantly high molecular weight (e.g., up to 1000 or more).

Examples of suitable functional groups of the surface modifiers for bonding to the nanoparticles are carboxyl groups, anhydride groups, acid amide groups, (primary, secondary, tertiary and quaternary) amino groups, SiOH groups, hydrolyzable radicals of silanes (group SiX described above in the formula (I)) and C—H-acid groups, e.g. β-dicarbonyl compounds. It is also possible for a plurality of these groups to be simultaneously present in one molecule (betaines, amino acids, EDTA, etc.).

Examples of compounds used for surface modification are unsubstituted or substituted (e.g. by hydroxy), saturated or unsaturated monocarboxylic and poly-carboxylic acids (preferably monocarboxylic acids) having from 1 to 24 carbon atoms and also their anhydrides, esters (preferably $C_1$-$C_4$-alkyl esters) and amides, e.g. methyl methacrylate.

Also suitable are amine compounds such as ammonium salts and monoamines or polyamines. Examples of these surface modifiers are quaternary ammonium salts of the formula $NR^1R^2R^3R^{4+}X^-$ where $R^1$ to $R^4$ are identical or different aliphatic, aromatic or cycloaliphatic groups preferably having from 1 to 12, in particular from 1 to 8, carbon atoms, e.g. alkyl groups having from 1 to 12, in particular from 1 to 8 and particularly preferably from 1 to 6, carbon atoms (e.g. methyl, ethyl, n- and i-propyl, butyl or hexyl), and $X^-$ is an inorganic or organic anion, e.g. acetate, $OH^-$, $Cl^-$, $Br^-$ or $I^-$; monoamines and polyamines, in particular those of the general formula $R_{3-n}NH_n$, where n=0, 1 or 2 and the radicals R are, independently of one another, alkyl groups having from 1 to 12, in particular from 1 to 8 and particularly preferably from 1 to 6, carbon atoms, and ethylenepolyamines (e.g. ethylenediamine, diethylene-triamine, etc.). Further examples are amino acids; imines; β-dicarbonyl compounds having from 4 to 12, in particular from 5 to 8, carbon atoms, e.g. acetylacetone, 2,4-hexanedione, 3,5-heptanedione, acetoacetic acid and $C_1$-$C_4$-alkyl acetoacetates, e.g. ethyl acetoacetate.

Further preferred compounds for surface modification of the nanoparticles are hydrolysable silane compounds having a non-hydrolysable substituent, for which reference can be made to those mentioned above for the preparation of the hydrolysate and/or condensate, especially the hydrolysable silanes represented by general formulas (I), (II) or (III).

Examples of non-polymerizable groups with which nanoparticles may be surface-modified are e.g. alkyl or aryl groups (e.g. the groups R and R' defined above in formulas (I) and (II) such as methyl and phenyl), e.g. by surface modification with hydrolysable silanes of general formulas (I) or (II) with the corresponding alkyl or aryl groups (e.g. DMDEOS (dimethyldiethoxy)silane or diphenyldi(m)ethoxysilane), or ionic groups such as ammonium groups, e.g. by surface modification with quaternary ammonium salts (e.g. THAH (tetrahexylammoniumhydroxide)). Examples of polymerizable groups, especially cationically polymerizable groups, with which nanoparticles may be surface-modified are epoxy, oxetane and vinylether groups, preferably epoxy groups, e.g by surface modification with organic diepoxides or epoxysilanes such as those represented by general formula (III) mentioned above.

The in situ preparation of surface-modified nanoparticles may be e.g. carried out by formation of nanoparticles by the conventional sol-gel method in the presence of the surface modifier. For example, $SiO_2$ particles can be prepared by the sol-gel process using hydrolysable silanes, e.g. alkoxides of Si, in the presence of an epoxysilane of formula (III) so that $SiO_2$ particles surface-modified with epoxy groups are obtained.

The relative amounts of the components of the composite composition of the invention can vary in wide ranges, but preferably the following amounts are used, based on the total solid content of the composite composition:
a) 10 to 79% by weight of at least one cationically polymerizable organic resin, which is solid at room temperature,
b) 0.5 to 10% by weight of a cationic photoinitiator,
c) 5 to 79% by weight of inorganic nanoparticles, and
d) 10 to 79% by weight of a hydrolysate and/or condensate of at least one hydrolysable silane compound.

It was surprisingly found that composite compositions of the invention comprising the components within the preferred amount ranges specified above could be used to prepare even more improved micropatternable films, e.g. on silicon wafers, with a high aspect ratio (height/width) and showing a high elastic modulus, as could be determined by indentation measurements.

The components may be combined in any conventional manner and order. The hydrolysate and/or condensate may also be prepared in situ in the presence of the inorganic particles and/or the cationically polymerizable epoxy compound.

The composite composition may comprise further conventional additives in accordance with the purpose and desired properties. Specific examples are thixotropic agents, crosslinking agents, solvents, UV absorbers, lubricants, levelling agents, wetting agents, adhesion promoters, and surfactants. The solvent content may be adjusted in order to achieve suitable properties such as viscosity for the application intended. Examples for solvents are e.g. the solvents mentioned above. Also other solvents may be used such as hydrocarbons, halogenated hydrocarbons, and aromatics.

For the preparation of a patterned layer as a coating or as a moulded piece, the composite composition of the present invention can be applied to a substrate or placed in a mould.

For preparing a substrate having a patterned coating or layer, the composite coating composition according to the present invention may be applied to any desired substrate. Examples thereof are metal, glass, ceramic, glass ceramics, crystalline and plastic substrates, but also paper, modified or unmodified natural substances, such as (natural) stones, clay, and building materials, concrete, and textiles.

Examples of metal substrates include copper, aluminium, silver, gold, platinum, palladium, nickel, chromium, iron, including (stainless) steel, tin, lead, titanium, and zinc as well as metal alloys, such as brass and bronze. Among the plastic substrates which form surfaces which can be coated with the above coating compositions are thermoplastics, thermosets, elastomers and foamed plastics. Especially preferred are thermally stable plastics. Examples of plastic substrates are polycarbonate, polyamide, polymethyl methacrylate, polyacrylates, and polyethylene terephthalate. Glass or ceramic substrates may be e.g. mainly based on $SiO_2$, $TiO_2$, $ZrO_2$, $PbO$, $B_2O_3$, $Al_2O_3$, and/or $P_2O_5$. Examples of crystalline substrates are silicon, quartz, lithium niobate and precious stones.

Among the modified or unmodified natural substances mention may be made in particular of those of natural stone (e.g. sandstone, marble, granite), (fired) clay and cellulose materials, while it is of course also possible to coat surfaces of concrete, ceramic, porcelain, gypsum, glass and paper (including synthetic paper) in an advantageous manner using the composite composition of the invention. The term "glass" includes all types of glass with a very wide variety of compositions, examples being soda lime glass, potash glass, borosilicate glass, lead glass, barium glass, phosphate glass, optical glass, and historical glass.

The above composite composition can also be applied to surfaces of oxides, carbides, silicides, nitrides, borides, etc. of metals and non-metals, for example surfaces which comprise or consist of metal oxides, carbides such as silicon carbide, tungsten carbide and boron carbide, silicon nitride, silicon dioxide, etc.

A particularly preferred substrate is silicon, e.g. in form of a silicon wafer. The substrate may be present in any form, such as, e.g., a plate, a sheet, a wafer, a film or a surface layer on a support of different material such as a coating. Of course, surface-treated substrates are also suitable, e.g., substrates having sand-blasted, coated or metalized surfaces, e.g. galvanized iron plates. In a particular embodiment, the substrate is coated with at least one base layer.

The composite composition may be applied to the substrate by any conventional means. In this context, all common wet-chemical coating methods may be used. Representatives methods are e.g. spin coating, dip coating, spray coating, web coating, bar coating, brush coating, flow coating, doctor blade coating and roll coating and printing methods, such as pat printing, silk screen printing, flexo printing and pad printing. A further suitable method is direct coating.

For preparing a moulded piece with a pattern, the composite composition of the invention is placed in a mould and used as moulding material. Any conventional moulding methods can be used, for example casting and film casting. The mould or the parts for contact with the composite composition are antiadhesive. Suitable materials therefore are PTFE, antiadhesive glass, metal such as Ni or materials to which release agents are applied.

Following application, the coating or moulded material may be dried, if necessary. This may be effected by allowing to stand at room temperature (about 20° C.), optionally supported by ventilation. The optional drying step preferably involves a heat treatment, for example at a temperature in the range of from 40 to 130° C., more preferably from 70 to 110° C., and particularly from 80 to 100° C. A particular preferred drying temperature is about 90° C. Of course, the drying time depends on the type of composite composition and the temperature used. In general, a drying time of 1 to 5 min, preferably 2 to 4 min, particularly about 3 min, may be sufficient, for example by using a heat treatment at about 90° C.

The composite composition applied to the substrate or placed in the mould is cured (hardened) in at least 2 or 3 steps. The curing step includes a cationic polymerisation of said organic resin and also of the cationically polymerizable groups in the hydrolysate and/or condensate, preferably present in the condensation product of the silanes. In the curing step, the condensation degree of the inorganic polycondensate may be enhanced. Further, the cationically polymerizable organic compound will generally polymerize which may include cross-linking, thereby forming the desired inorganic-organic hybrid material, in which the inorganic particles are embedded.

In step (2) the formed layer is patternwise irradiated. Any conventional method can be used, for example a photolithographic method or a two-wave-mixing method. The appropriate irradiation depends e.g. on the type of materials and the cationic photoinitiator used. Typically, the radiation used may comprise a wavelength within the range of 360 to 420 nm. For example, UV radiation, radiation in the visible region (VIS), especially blue light, or laser light may be employed.

During the step of exposure to light or radiation (photocuring) and also during thermal curing, the cationic initiator generates an acid (photo-acid generation). Besides the polymerisation of the cationically polymerizable compound and the epoxy groups of the condensation product, this acid may also assist in curing the siloxane framework (inorganic condensation).

By the patternwise irradiation, the curing by cross-linking and condensation reactions, of course, mainly proceeds in the areas exposed to light or radiation, in which the curing degree is enhanced.

The following heat treatment of the layer (step 3), also called post-exposure baking, is important for the formation of the organic network. Usually, the temperature used for this post-exposure baking should be higher than the glass transition temperature of the layer treated. The heat treatment may be carried out, for example at a temperature in the range of from 40 to 130° C., preferably from 70 to 110° C., and more preferably from 80 to 100° C. A particular preferred curing temperature is about 90° C. Of course, the curing time depends on the type of composite composition and the temperature used. In general, a curing time of 1 to 10 min, preferably 2 to 4 min, particularly about 3 min, may be sufficient, for example by using a heat treatment at about 90° C.

After the post-exposure baking, the layer is submitted to a developing step (4), wherein the layer is treated with a solvent. The treatment may be achieved e.g. by dipping the layer into the solvent or rinsing or rubbing the layer with the solvent. Any suitable solvent known in the art can be used. All solvent mentioned above can be used. Preferred solvents are polar organic solvents such as ketones, ethers or alcohols. Also water or aqueous solutions may be appropriate. In the developing step, the solvent dissolves the areas of the layer which had not be exposed to radiation during step (2), whereas the areas exposed to radiation during step (2) are not dissolved. Normally, the unexposed areas are dissolved until the substrate or mould surface is reached, i.e. the unexposed areas will be completely dissolved. In order to increase the developing rate, the solvent may be stirred or heated. The appropriate solvent can be easily selected by the skilled person. Surprisingly, solvents of lower dissolving power than e.g. ketones such as e.g. alcohols can be used in the process of the present invention.

The patterned layer is optionally submitted to a final curing (5), wherein the curing is essentially completed or nearly completed. Thereby, the mechanical and chemical resistance can be improved. The final curing step may be effected by irradiating the entire patterned layer or preferably by heating the layer. For photocuring, the methods and devices described for step (2) can also be used, provided that no patternwise irradiation is necessary. If the final curing is carried out by the preferred heat treatment, e.g. temperatures in the range of 140 to 220° C. are appropriate. The temperature is preferably in the range of 160 to 220° C. and more preferably in the range of 180 to 220° C. Particularly preferred is a temperature of about 200° C.

In the case of preparing a moulded article, the patterned layer is detached from the mould. This may be done, e.g., during or after developing step (4) or after final curing step (5). The final moulded article may be in the form of a sheet, a film, a plate or any other shape and comprise a pattern. For convenience, such moulded articles are also referred to as layer in the description.

The thickness of the final patterned layer may vary within wide ranges, usually in the range of 5 to 80 μm, preferably in the range of 10 to 50 μm, and especially around 20 μm for substrates coated with the patterned layer, and in the range of 0.5 mm to 0.5 cm, for example about 1 mm, for patterned moulded articles, e.g. in form of a film or sheet.

Thus, the composite composition can advantageously be used for pattern-forming methods for both coatings and moulded articles. By using the composite composition of the present invention in such a pattern-forming method, it is possible to obtain a pattern which includes portions having an aspect ratio H/W≥1 (H: pattern height, W: pattern width), preferably an aspect ratio H/W≥2. It is also possible to form micropatterns which comprise portions having a pattern width of 100 micrometer or less.

It was unexpected that by using the composite composition of the present invention micropatterned layers could be formed showing no residual stresses and having an excellent elastic modulus after being coated on a substrate such as silicon wafers or placed in a mould. This could be shown by measuring the bending curvature of a coated silicon substrate after curing. No bending was observed.

The coatings or the moulded articles of the invention are especially useful, if the coating or the moulded article are to be contacted with alkaline solutions, but it is also useful in combination with neutral and/or acid solutions.

The composite compositions of the invention are particularly suitable for coatings and moulded pieces for instruments, accessories and devices for medical purposes, and especially for micro machine and microelectromechanical system (MEMS) fields. Examples are, in particular in said fields, sensor applications, optical devices (such as micro lenses, and gratings and adhesives), electronic components, cantilever, microbulb, and actuator devices. The composite composition may be also suitable for a moulded piece that is part of the articles mentioned or that is article as such.

Over recent years, needs for high function coatings are increasing. In flat panel display field, kinds of patterned layer, such as color filter, TFT are incorporated. For example, a kind of color filter for LCD requires a barrier pattern to divide each pixel. In some cases, such pattern should have, high durability, high chemical resistance, stiffness, and a certain surface property (lower surface energy), in addition to high precision. The composite composition are also suitable for such high function coatings.

The following examples illustrate the invention without limiting it.

EXAMPLES

Examples 1 to 4

Hydrolysable condensation product containing silica nanoparticle was prepared according to the following procedures.

Preparation of Nanoparticle Solution (a)

924 g of colloidal silica solution containing 13 wt % of $SiO_2$ (PL-1, Fuso Chemical Co.) and 22 g of GPTES were mixed and heated for 24 hours under reflux. Appropriate amount of isopropanol was removed by evaporation.

Preparation of Nanoparticle Solution (b)

462 g of colloidal silica solution containing 13 wt % of $SiO_2$ (PL-1, Fuso Chemical Co.) and 5.3 g of DMDEOS were mixed and heated for 24 hours under reflux. Appropriate amount of isopropanol was removed by evaporation.

Preparation of Synthetic Example (A)

56 g of glycidylpropyltriethoxysilane (0.2 mol), 48 g of phenyltriethoxysilane (0.2 mol), 836 g of nanoparticle solution (a), 22 g of 0.01M hydrochloric acid were stirred at room temperature, subsequently refluxed for 24 hours, so that a hydrolysable condensation product containing nanoparticles was obtained.

Preparation of Synthetic Example (B)

Synthetic example (B) was prepared in similar way to example (A), using 93 g of nanoparticle solution (b) instead of solution (a).

Preparation of Synthetic Example (C)

11 g of glycidylpropyltriethoxysilane (0.04 mol), 48 g of phenyltriethoxysilane (0.2 mol), 40 g of hexyltriethoxysilane, 329 g of nanoparticle solution (a), 22 g of 0.01 M hydrochloric acid were stirred at room temperature, subsequently refluxed for 24 hours, so that condensation product containing nanoparticles was obtained.

Preparation of Synthetic Example (D)

56 g of glycidylpropyltriethoxysilane (0.2 mol), 54 g of diphenyldiethoxysilane (0.2 mol), 442 g of nanoparticle solution (a), 18 g of 0.01 M hydrochloric acid were stirred at room temperature, subsequently refluxed for 24 hours, so that hydrolysable condensation product was obtained.

Composite compositions shown in Table 1 (examples 1 to 4) were prepared, using synthetic examples A to D, epoxy resin (EHPE from Daicel Chemical Industries, Ltd.), and photoinitiator (SP172 from Asahi Denka Co., Ltd.). Solvents were removed (evaporation process), if necessary.

Comparative Examples 1 to 3

The composite composition of comparative example 1 was prepared in a manner similar to example 1, except that nanoparticles were not used. The composite composition of comparative example 2 was prepared in similar way to example 1, except that silane compounds were not used. The composite composition of comparative example 3 was prepared in a manner similar to example 1, except that epoxy resin was not used.

TABLE 1

| No. | synthetic example (nanoparticle/silane) | resin | initiator |
|---|---|---|---|
| Example-1 | A (50/25) | EHPE (25) | SP172 (2) |
| Example-2 | B (10/45) | EHPE (45) | SP172 (3) |
| Example-3 | C (30/35) | EHPE (35) | SP172 (2) |
| Example-4 | D (30/35) | EHPE (35) | SP172 (2) |
| Comparative Example-1 | A' (0/50) | EHPE (50) | SP172 (2) |
| Comparative Example-2 | A'' (50/0) | EHPE (50) | SP172 (2) |
| Comparative Example-3 | A (50/25) | none | SP172 (2) |

( ): parts by weight

By applying composite composition examples 1 to 4 and comparative examples 1 to 3, on the silicon substrate by spin coating, coating layers were formed on the substrate. The coating thickness was about 20 micrometer. Subsequently, after prebaking at 90° C. for 3 minutes, pattern exposure was performed by mean of mask aligner (MPA600 super by Canon Inc.). Then heating was performed at 90° C. for 4 minutes, and development was carried out using methyl isobutyl ketone (MIBK), followed by rinsing with isopropyl alcohol, thereby a evaluation pattern was obtained. After curing by baking at 200° C. for 1 h, the elastic modulus was measured. Results are shown in Table 2.

By the use of a line & space mask having intervals of 2 to 20 μm as an evaluation pattern, the resolution properties of each composition was evaluated. The elastic modulus was measured by HP100C of Helmut Fischer GmbH.

TABLE 2

| No. | Coating appearance | patterning (resolution) (μm) | elastic modulus (GPa) |
|---|---|---|---|
| Example-1 | smooth, clear | 8 | 7.7 |
| Example-2 | smooth, clear | 6 | 4.5 |
| Example-3 | smooth, clear | 6 | 6.1 |
| Example-4 | smooth, clear | 10 | 5.6 |
| Comparative Example-1 | smooth, clear | 6 | 3 |
| Comparative Example-2 | turbid, cloudy | 20< | — |
| Comparative Example-3 | smooth, clear | 20< | — |

The results of table 2 show the advantage of the compositions according to this invention with respect to coating property, patterning property and hardness.

Example 5

For preparing a composite composition, 20.9 g of (3-glycidyloxypropyl)triethoxysilane (GPTES, 0.08 mole) were mixed with 84.2 g of a dispersion of dimethyldiethoxy-silane (DMDEOS)-modified silica nanoparticles (0.23 mole) as well as 8.1 g of 0.01 M hydrochloric acid as a catalyst and reacted for 1 hour under reflux and stirring. 18.0 g of phenyltriethoxysilane (PhTES, 0.08 mole) were subsequently added thereto and the resulting mixture was stirred for further 24 hours under reflux. After cooling down to ambient temperature 63.5 g of 1-propanol (from $SiO_2$-dispersion) were removed under reduced pressure (approx. 35° C. water bath, max. 20 mbar). Afterwards 9.5 g of organic epoxy resin EHPE-3150 (product of Daicel Chemical; epoxy resin having structural unit (1) mentioned above, melting point 70° C.) were added to the resulting $SiO_2$-modified silane solution and the resulting mixture was stirred at ambient temperature until EHPE-3150 was dissolved. Subsequently a cationic photoinitiator UVI-6976 was added thereto in a catalytic amount. The resulting solution was stirred at ambient temperature for about 1 hour. It was possible to dissolve EHPE-3150 in ethanol before mixing with the silane solution and no further stirring was necessary, but after addition of photoinitiator the coating solution was stirred at ambient temperature for about 16 hours. The coating solution may be filtered by a glass-fibre filter with a pore diameter of approx. 5 μm before application.

Example 6

For preparing a composite composition, 20.9 g of (3-glycidyloxypropyl)triethoxysilane (GPTES, 0.08 mole) were mixed with 8.1 g of 0.01 M hydrochloric acid as a catalyst and reacted for 1 hour under reflux and stirring. 18.0 g of phenyltriethoxysilane (PhTES, 0.08 mole) were subsequently added thereto and the resulting mixture was stirred for further 24 hours under reflux. After cooling to ambient temperature 18.7 g ethanol resulting from hydrolysis/condensation reaction of silanes, were removed by distillation (approx. 35° C. water bath, max. 20 mbar). Afterwards 178.9 g of a dispersion of tetrahexylammoniumhydroxide (THAH)-modified silica nanoparticles (0.53 mole) were gradually added under stirring at ambient temperature. The SiO$_2$-modified hydrolyzate was subsequently stirred at room temperature for further 30 minutes and then 117.7 g of 1-propanol (from SiO$_2$-dispersion) were removed under reduced pressure (approx 35° C. water bath, max. 20 mbar). 9.5 g of organic epoxy resin EHPE-3150 (product of Daicel Chemical; epoxy resin having structural unit (1) mentioned above, melting point 70° C.) were added to the resulting SiO$_2$-modified silane solution and the resulting mixture was stirred at ambient temperature until EHPE-3150 was dissolved. Subsequently a cationic photoinitiator UVI-6976 was added thereto in a catalytic amount. The resulting solution was stirred at ambient temperature for about 1 hour. It was possible to dissolve EHPE-3150 in ethanol before mixing with the silane solution and no further stirring was necessary, but after addition of photoinitiator the coating solution was stirred at ambient temperature for about 16 hours. The coating solution may be filtered by a glass-fibre filter with a pore-diameter of approx. 5 µm before application.

The composite composition obtained was applied to silicon wafers using the spin coating method (500 rpm for 10 to 30 s), followed by pre-baking at 90° C. for 3 minutes, structuring by exposing to UV light (325-380 nm) for 5 to 30 s using a special mask and post exposure baking at 90° C. for 4 minutes. Thereafter, the unexposed parts were washed out by immersion in 4-methyl-2-pentanone (MIBK) for minute and rinsing with isopropyl alcohol. In order to thoroughly cure the coating resin, heating treatment was performed, at first at a temperature of 100° C. for 1 hour followed by a treatment at 200° C. for 1 hour.

The invention claimed is:

1. A composite composition comprising
   a) 10 to 79% by weight of at least one cationically polymerizable organic resin, which is solid at room temperature,
   b) 0.5 to 10% by weight of a cationic photoinitiator,
   c) 5 to 79% by weight of inorganic nanoparticles, and
   d) 10 to 79% by weight of a hydrolysate and/or condensate of hydrolysable silane compounds comprising:
      1) a hydrolysable silane compound having at least one aryl group,
      2) a hydrolysable silane compound having at least one cationically polymerizable group, and
      3) a hydrolysable alkylsilane represented by the general formula (I)

$$R_aSiX_{(4-a)} \qquad (I)$$

wherein R, which may be the same or different, is an alkyl substituent, X is a hydrolysable substituent, and a is an integer from 1 to 3.

2. The composite composition according to claim 1 wherein the melting point of said cationically polymerizable organic resin is greater than or equal to 40° C.

3. The composite composition according to claim 1 wherein said cationically polymerizable organic resin comprises at least 3 cationically polymerizable groups in one molecule.

4. The composite composition according claim 1 wherein said cationically polymerizable organic resin comprises at least one structural unit selected from formulae (1) and (2)

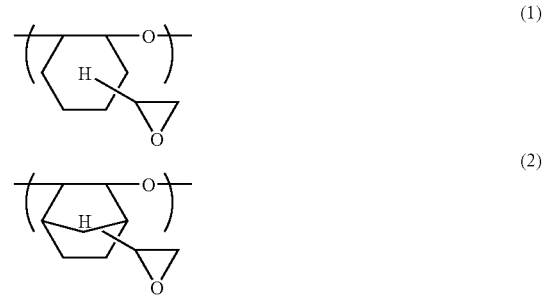

or is a compound represented by following general formula, wherein n is an integer from 1 to 3

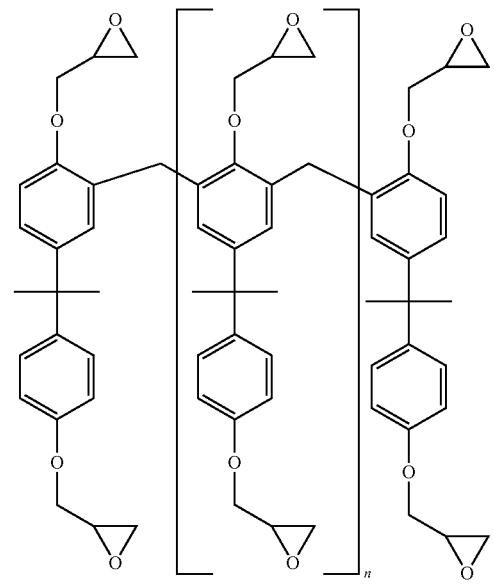

5. The composite composition according claim 1 wherein the mean particle diameter of said inorganic nanoparticles is in the range of 1 nm to 100 nm.

6. The composite composition according claim 1 wherein said inorganic nanoparticles are surface-modified.

7. The composite composition according to claim 6 wherein said inorganic nanoparticles are surface-modified with polymerizable and/or non-polymerizable groups.

8. The composite composition according to claim 6 wherein said inorganic nanoparticles are surface-modified with alkyl, aryl, epoxy, oxetane or vinylether groups.

9. The composite composition according to claim 6 wherein said inorganic nanoparticles are surface-modified with an ammonium salt as surface modifier.

10. The composite composition according to claim 1 wherein said hydrolysable silane compound or at least one of the hydrolysable silane compounds has a fluorine atom.

11. A process of preparing a patterned layer as a coating or as a moulded article, the process comprising:
   (1) applying a composite composition according to claim 1 to a substrate or placing the composite composition in a mould,
   (2) patternwise irradiation of the formed layer of the composite composition for photo-acid generation,
   (3) subjecting the layer to a heat treatment for cationic polymerisation, and
   (4) developing the layer by treating it with a solvent.

12. The process of claim 11 further comprising irradiating or heating the patterned layer for further curing.

13. A substrate having a patterned layer thereon, obtainable by the process of claim 11.

14. A moulded article comprising at least on patterned surface, obtainable by the process of claim 11.

15. The composite composition according to claim 9 wherein said inorganic nanoparticles are surface-modified with tetrahexylammoniumhydroxide.

16. The composite composition according to claim 6, wherein said inorganic nanoparticles are surface-modified with at least one hydrolysable silane having at least one non-hydrolysable substituent.

17. The composite composition according to claim 1, wherein the hydrolysable silane compound having at least one aryl group is represented by the general formula (II),

$$R'_a SiX_{(4-a)} \qquad (II)$$

wherein R', which may be the same or different, is a non-hydrolysable substituent selected from alkyl, aryl, and alkylaryl, at least one of which is an aryl or alkylaryl group, X is a hydrolysable substituent, and a is an integer from 1 to 3, and wherein the hydrolysable silane compound having at least one cationically polymerizable group is represented by the general formula (III)

$$RcSi(R)_b X_{(3-b)} \qquad (III)$$

wherein Rc is a non-hydrolysable substituent having a epoxy group, R is a non-hydrolysable substituent, X is a hydrolysable substituent, and b is an integer from 0 to 2.

* * * * *

UNITED STATES PATENT AND TRADEMARK OFFICE
CERTIFICATE OF CORRECTION

PATENT NO. : 8,680,179 B2  
APPLICATION NO. : 12/373750  
DATED : March 25, 2014  
INVENTOR(S) : Hino et al.

Page 1 of 1

It is certified that error appears in the above-identified patent and that said Letters Patent is hereby corrected as shown below:

On the Title page, item (75), the Inventors should be changed from:

[[Etsuko Hino, Tokyo (JP);  
Mitsutoshi Noguchi, Tokyo (JP);  
Norio Ohkuma, Tokyo (JP);  
Yoshikazu Saito, Tokyo (JP);  
Carsten Becker-Willinger, Saarbruecken (DE);  
Pamela Kalmes, Merchweiler (DE);  
Michael Veith, St.-Ingert (DE)]]

to:

--Carsten Becker-Willinger, Saarbruecken (DE);  
Pamela Kalmes, Merchweiler (DE);  
Michael Veith, St.-Ingert (DE);  
Etsuko Hino, Tokyo (JP);  
Mitsutoshi Noguchi, Tokyo (JP);  
Norio Ohkuma, Tokyo (JP);  
Yoshikazu Saito, Tokyo (JP)--

Signed and Sealed this  
Sixteenth Day of September, 2014

Michelle K. Lee  
*Deputy Director of the United States Patent and Trademark Office*